United States Patent [19]

De With et al.

[11] Patent Number: 4,965,249
[45] Date of Patent: Oct. 23, 1990

[54] METHOD OF MANUFACTURING A SUPERCONDUCTING WIRE

[75] Inventors: Gijsbertus De With; Jan W. Severin, both of Eindhoven, Netherlands

[73] Assignee: U.S. Philips Corporation, New York, N.Y.

[21] Appl. No.: 249,634

[22] Filed: Sep. 23, 1988

Related U.S. Application Data

[63] Continuation-in-part of Ser. No. 126,393, Nov. 30, 1987, abandoned.

[30] Foreign Application Priority Data

Oct. 2, 1987 [NL] Netherlands .................. 8702351

[51] Int. Cl.$^5$ ............................................. H01B 12/00
[52] U.S. Cl. ............................................. 505/1; 29/599; 264/61; 505/740
[58] Field of Search .................. 264/61, 62, 63, 56; 29/599; 148/11.5 P, 11.5 Q; 505/1, 800, 813, 822, 823, 739, 740, 742

[56] References Cited

U.S. PATENT DOCUMENTS

| | | | |
|---|---|---|---|
| 3,694,270 | 9/1972 | Pfisterer et al. | 174/126 S X |
| 4,171,464 | 10/1979 | Steyert, Jr. | 29/599 X |
| 4,386,970 | 6/1983 | Fukutsuka et al. | 29/599 X |
| 4,411,172 | 10/1983 | Marancik | 148/11.5 F X |
| 4,411,959 | 10/1983 | Braginski | 428/558 |
| 4,531,982 | 7/1985 | Dubots | 148/11.5 F |
| 4,594,218 | 6/1986 | Dubots et al. | 174/126 S X |
| 4,629,515 | 12/1986 | Imaizumi et al. | 148/11.5 F |
| 4,704,249 | 11/1987 | Glatzle | 29/599 X |
| 4,746,581 | 5/1988 | Flukiger | 148/11.5 F X |
| 4,752,654 | 6/1988 | Iida et al. | 29/599 X |

OTHER PUBLICATIONS

Jin et al, "High $T_c$ Superconductors–Composite Wire Fabrication", Appl. Phys. Lett. 51(3), 20 Jul. 1987, pp. 203–204.

Poeppel et al, "Fabrication of $YBa_2Cu_3O_7$ Superconducting Ceramics", Chemistry of High-Temperature Superconductors, Aug.–Sep. 1987, pp. 261–265.

Primary Examiner—Mary Lynn Fertig
Attorney, Agent, or Firm—Norman N. Spain

[57] ABSTRACT

A method of manufacturing a wire of superconducting oxidic material, in which a preform is used, which includes dispersions of a superconducting material and of a non-superconducting material in a binder or which includes dispersions of non-superconducting materials in a binder, in which latter case the materials can react while forming a superconducting compound, in which the preform is extruded to a wire, the binder is baked out and the wire is sintered.

9 Claims, 2 Drawing Sheets

METHOD OF MANUFACTURING A SUPERCONDUCTING WIRE

The instant application is a continuation-in-part of application Ser. No. 126,393 filed Nov. 30, 1977 and now abandoned.

The invention relates to a method of manufacturing a superconducting wire of a superconducting material of the oxidic type.

Such a method is disclosed in the Herald Tribune of 10-4-1987. It is described herein that it must be deemed to be possible to manufacture wires of superconducting oxidic material by means of a drawing process, in which thin filaments are drawn, which can be coated with metal, such as Cu.

The superconducting oxidic material as such is known from various publications. Reference may be made inter alia to the first publication in this field by J. G.. Bednorz and K. A.. Müler in "Zeitschrift fur Physik" B, Condensed Matter 64, p. 189-193 of September 1986. In this first publication, mention is made of the superconducting character of materials of the La—Ba—Cu—O system at a comparatively high Tg. From later publications, such as "Physical Review Letters"0 58, No. 9, p. 908-910 (1987) it is known that also other oxidic (ceramic) materials have a comparatively high Tg of, for example 80°-90° K. a superconduction, such as materials of the Y—Ba—Cu—O system. Further, Ba may be replaced by Sr and Ca.

From further publications, such as "Physical Review Letters" 58, No. 18, p. 1676-1679 (1987) and "International Business Week" of 6 Apr. 1987, p. 54-60, it appears that the most suitable method of manufacturing the superconducting oxidic material in bulk form consists in that the oxides and/or carbonates of the constituent elements of the superconducting material are mixed in pulverulent form and are ground. The mixture is heated and compressed to pellets or cylinders and is then sintered at high temperature in an oxygen atmosphere. As suggested in the first-mentioned publication, very thin filaments can then be drawn from these products.

The invention has for its object to provide a new method of manufacturing superconducting wires, which offers advantages in comparison with the known method.

A first object of the invention is to provide a method, in which in the wire obtained the superconducting material is shielded from the environment and more particularly is embedded in a non-superconducting material, which preferably has a good electrical conductivity, however.

A second object is to provide a method, in which it is possible to provide in one wire many superconducting filaments, which have very small diameter dimensions.

Another object is to provide a method, in which the desired diameter and the desired configuration of the wire to be manufactured can be adjusted and realized in a simple manner.

As will appear from the following description, this object and further objects are realized by means of a method of the kind described above, in which a mainly cylindrical preform is manufactured, which comprises a rod-shaped filament (F) product which is embedded in and surrounded by a matrix (M) product, the F and the M product both containing a binder, in which pulverulent oxidic material is dispersed, in which either the F product or the M product, comprises a superconducting oxidic material, in which event the other one of the said two products comprises a non-superconducting oxidic material, which is non-reactive with respect to the superconducting material, or the F product and the M product both comprise a non-superconducting oxidic material, which are reactive with respect to each other and produce by means of a solid state reaction a superconducting material, in which the preform is deformed by means of an extrusion process to a wire of the desired diameter and, in case the F and the M product comprise the said reactive materials, the wire obtained is then heated, the binder being decomposed and baked out, whereupon the remaining material is sintered.

The suspension of the pulverulent oxidic material in the binder may be prepared, for example, by intimately mixing the binder, a solvent for the binder and the oxidic material and grinding this mixture, for example, in a ball-mill. Additions may be added to the mixture, such as a disperging agent and a lubricant.

A suitable binder is, for example, nitrocillulose polyvinyl alcohol, polyvinylchloride, polyvinyl acetate, polyacrylates, polyesters, polyester amides, polyurethanes and copolymers of at least two monomers chosen from the group consisting of vinylchloride, vinylacetate, acrylonitrile, vinyl alcohol, vinyl butyral and vinylidene chloride. As a solvent for the binder, use is made of organic liquids, such as esters, for example ethyl acetate, ethers, such as tetrahydrofurane, ketones, such as methyl ethyl ketone and cyclohexanone, hydrocarbons, such as toluene, or chlorinated hydrocarbons, such as 1,2-dichloroethane. An important addition is a disperging agent, by which the agglomeration of particles of the pulverulent material in the binder is avoided or reduced. Examples of suitable dispersing agents are lecithine, mono- or diesters of phosphoric acid and alcohols that may be ethoxylated, alkylaryl sulphonic acids or salts thereof. The dispersing agent is used in a quantity of 1 to 10% by weight calculated on the oxidic material.

Another addition is a lubricant, which is used in a quantity of, for example, 0.1 to 10% by weight calculated on the quantity of binder. Suitable lubricants are fatty acids, such as stearic acid, fatty acid esters, or salts, such as zinc stearate, oils, such as silicone oil, and sulphides, such as molydenium disulphide and graphite.

The quantity of the oxidic material in the dispersion is preferably 40 to 60% by volume. With this high "charging", the superconducting character of the wire obtained is increased.

The preform can be manufactured in different ways. A very suitable manner is the use of an extrusion process. As is known, in this case an extruder is used comprising a mostly cylindrical container for the substance to be extruded, which is provided at one end with a spray head provided with one or more openings and at the other end comprises means by which pressure is exerted on the substance to be extruded. Thus, the preform can be manufactured by the use of an extruder, of which the spray head has a central opening for the passage of the F product and an annular gap arranged to surround the central opening for the passage of the M product. A preform is then obtained, in which a rod-shaped F product is accommodated in a tube of the M product. The extruder used must therefore have a separated supply for the F and for the M product.

Further, a simple extruder may be used, by which rods of both F product and M product are manufactured. The rods are joined so that an F rod is entirely surrounded by a bundle of M rods. By radial pressure, this assembly can be compacted to form a cylinder.

The preform may also be manufactured by means of an injection-moulding or transfer moulding process. The dispersions are then pressed at elevated temperature and pressure into a jig or mould corresponding to the preform, after which the composite body obtained is detached from the jig or mould.

In the case of extrusion of the preform, a thin wire is obtained. The diameter of the wire depends upon the outlet opening of the extruder, the pressure applied and the physical properties, such as the viscosity of the material of the preform. By means of the method according to the invention, very thin wire diameters can be obtained, such as a wire diameter smaller than 1 $\mu$m, for example 0.1$\mu$m. During or after extrusion, any solvent present is removed. This may take place spontaneously by evaporation in air, or forcibly in, for example, a counterflow of dry gas.

The wire may be shaped into any desired configuration and may be wound, by way of example, in helical form or in S-Z form.

In the case in which the F product and the M product comprise a non-superconducting reactive oxidic material, after the aforementioned shaping of the wire, the binder is baked out and the wire is sintered.

In a favourable embodiment of a method according to the invention, also in the case in which a preform is used in which either the F product or the M product comprises a superconducting oxidic material, the wire obtained after extrusion is heated, in which event the binder is decomposed and is baked out, whereupon the wire is sintered. As a result, the superconducting properties of the wire are improved.

The temperature at which the binder is decomposed and is baked out strongly depends upon the type of binder employed. A suitable baking-out temperature lies, for example, between 400° and 600° C. The decomposition and baking-out process is preferably carried out in an oxygen-containing atmosphere, such as air or oxygen gas.

In a preferred embodiment of the method according to the invention, an oxygen-containing binder is used. Due to partial or entire self-oxidation, the removal of the binder is effected in a simpler and/or completer manner. This especially applies to an endothermic binder, that is to say a binder which upon decomposition leads to an exothermic reaction. A suitable example of such a binder is nitrocellulose. With a comparatively small temperature increase, a spontaneous and complete decomposition to gaseous products takes place.

The sintering process is carried out at a considerably higher temperature than the baking-out temperature of the binder. The sintering process preferably also takes place in an oxygen-containing atmosphere. A suitable sintering temperature lies, for example, between 900° and 1300° C. and is, for example, 1100° C. At such a high temperature, the reactive non-superconducting oxidic materials of the F product and the M product diffuse and a mutual reaction takes place, in which a superconducting compound is formed.

In a preferred embodiment of the method according to the invention, a superconducting multifilament wire is manufactured. In this embodiment of the method, a preform is used in which a number of rod-shaped filament (F) products are embedded and surrounded by the M product; the preform is extruded to a wire, which, if desired is heated, during which treatment the binder is removed, whereupon the wire is sintered, the superconducting wire obtained having a multifilament structure, in which a number of superconducting filaments are embedded in a non-superconducting oxidic material.

The multifilament wire obtained has an elevated critical current density and an increased critical magnetic field. Moreover, the possibility is small that due to a disturbance caused, for example, by an alternating external magnetic field such a quantity of thermal energy is produced that a passage to the non-superconducting state takes place. Further, the advantage is obtained that in the case of an unintentional local passage to the non-superconducting state, the electric current is drained at least in part via the electrically conducting matrix material, in which moreover part of the heat developed is dissipated. As a result, the risk of complete destruction of the wire is reduced.

In another preferred embodiment of the method according to the invention, a preform is used, in which the F product and the M product, respectively, comprise a superconducting oxidic material corresponding to the formula $YBa_2Cu_3O_{7-\delta}$, where $\delta=0.1-0.5$, or to the formula $La_xMe_{2-x}CuO_4$, where Me is chosen from the group comprising Ba, Sr and Ca and x has a value lying between 1 and 2, while the non-superconducting non-reactive oxidic material of the M product and of the F product, respectively, is constituted by the oxide of one or more constituent elements of the aforementioned superconducting material or mixtures of such oxides.

Examples of such non-superconducting oxides are: $BaO$, $CuO$, $Y_2O_3$, $BaCuO_2$, $Y_2Cu_2O_5$ and $Y_2BaCuO_5$. With the use of mixtures of such oxides, care should be taken that no oxides are chosen which together can react to form a superconducting material. The choice can be determined by means of a phase diagram, such as the $Y_2O_3$—$BaO$—$CuO$ phase diagram discussed hereinafter.

In a further favourable embodiment, a preform is used in which the F product and the M product comprise a non-superconducting reactive oxidic material, diffusion of the oxidic materials taking place at the interface of the two products and these materials being converted by means of a solid state reaction into a superconducting compound of the formul $YBa_2Cu_3O_{7-\delta}$, where $\delta=0.1-0.5$, or of the formula $La_xMe_{2-x}CuO_4$, where Me is chosen from the group comprising Ca, Sr and Ba and x has a value lying between 1 and 2.

A person skilled in the art can derive from the aforementioned phase diagram, what oxides of one or more of the constituent elements of the superconducting material can react with respect to each other whilst forming the desired superconducting material.

With the following mixtures of oxides, satisfactory results are obtained:
1. $CuO$ and $Y_2Ba_4O_7$,
2. $BaCuO_2$ and $Y_2Cu_2O_5$,
3. $La_2CuO_4$ and $LaMeO_4$, where Me is chosen from Ca, Sr and Ba.

The invention will be described more fully with reference to the the following example and the drawing, in which.

EXAMPLE

Figure 1:
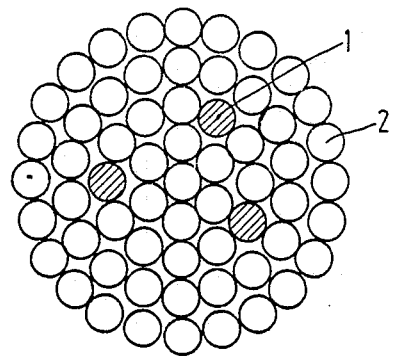
FIG. 1 shows a cross-section of a preform used in the method according to the invention.
Figure 2:
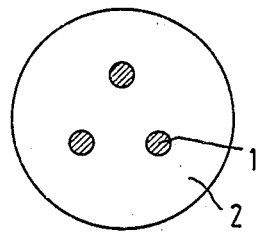
FIG. 2 shows in cross-section a preform obtained by compacting the preform shown in FIG. 1.

A mixture comprising 60% by weight of a pulverulent superconducting material corresponding to the formula $YBa_2Cu_3O_{7-\delta}$, where $\delta=0.1-0.5$ and 2% by weight of lecithine and for the remaining part a binder, such as especially nitrocellulose, is ground for a few hours in the presence of a solvent for the binder in a ball-mill. The mixture is processed by means of an extruder to a number (such as three) of cylindrical rods, which are denoted in FIG. 1 by reference numeral 1. In the same manner, rods 2 are manufactured, which comprise instead of the said superconducting material a pulverulent non-superconducting oxidic material corresponding to the formula $Y_2BaCuO_5$. This material is non-reactive with respect to the aforementioned $YBa_2Cu_3O_{7-\delta}$. The rods 1 and 2 are arranged in the manner shown in FIG. 1. The rods have a diameter of a few millimeters, for example 5 mm. Subsequently, a pressure is exerted in radial direction on the bundle of rods, during which process the spaces between the rods disappear. The preform obtained is shown in FIG. 2, in which the same reference numerals are used as in FIG. 1.

Figure 3:
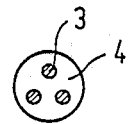
FIG. 3 shows in cross-section a superconducting wire obtained in accordance with the invention.

The preform is then deformed by means of an extrusion process to a wire having a diameter of 15 μm. The solvent evaporates in air. The wire is shaped into the desired configuration and is wound, for example, helically. The wire is then subjected to a first temperature treatment, in which the wire is heated to a temperature of 400° C. As a result, the nitrocellulose is entirely decomposed to gaseous products so that no residue remains in or on the wire. Subsequently, a second temperature treatment is carried out, in which the wire is kept for a few hours at a temperature of 1300° C. The wire is sintered due to this temperature treatment. The superconducting wire obtained is shown in FIG. 3, in which reference numeral 3 denotes the filaments obtained of the superconducting material having the aforementioned composition and reference numeral 4 denotes the matrix of non-superconducting material of the aforementioned formula. The filaments are entirely embedded in the matrix.

In quite the same manner as described above, a preform is manufactured, in which the rods 1 comprise the non-superconducting oxidic material of the formula $Y_2Cu_2O_5$ and the rods 2 comprise the non-superconducting oxidic material of the formula $BaCuO_2$. After extrusion of the preform, baking-out of the binder and sintering, a superconducting wire is obtained which is shown in FIG. 4.

Figure 4:
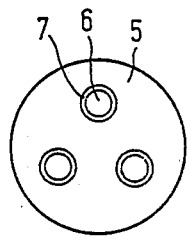
FIG. 4 shows in cross-section another embodiment of a superconducting wire obtained in accordance with the invention.

In FIG. 4, reference numeral 5 denotes the sintered material of the formula $Y_2Cu_2O_5$ and reference numeral 6 denotes the sintered material of the formula $BaCuO_2$. During the sintering process, the superconducting compound of the formula $YBa_2Cu_3O_{7-\delta}$ is formed at the interface of the two materials so that tubular filaments 7 of superconducting material are obtained, which are embedded in the non-superconducting materials 5 and 6.

Figure 5:
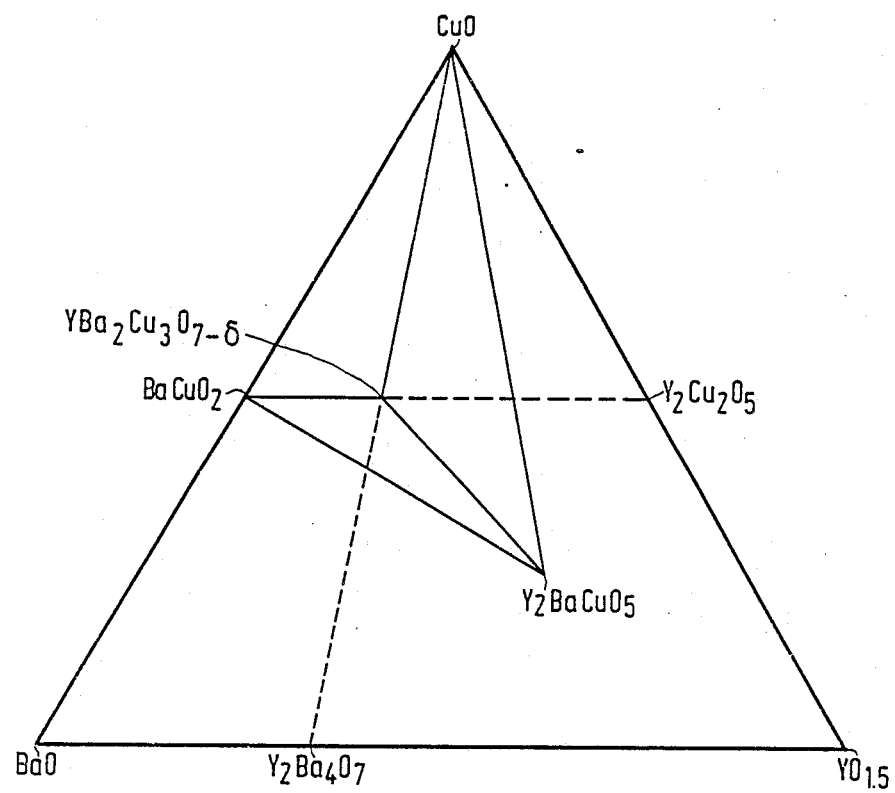
FIG. 5 shows the $Y_2O_3$—BaO—CuO phase diagram.

In FIG. 5 the phase diagram of CuO—BaO—$YO_{1,5}$ is represented. As shown by means of a partly dotted line the non-superconducting compound $Y_2Cu_2O_5$ will combine with the non-superconducting compound $BaCuO_2$ to form the superconducting compound $YBa_2Cu_3O_{7-\delta}$. Also the non-superconducting superconducting CuO combines with the non-superconducting $Y_2Ba_4O_7$ to form the above given superconducting compound. Furthermore the diagram shows three segregation (decomposition) zones. The triangle with the corners $BaCuO_2$—$Y_2BaCuO_5$—$YBa_2Cu_3O_{7-\delta}$ represents one decomposition zone in which any compound present in said zone will decompose into the products represented by said corners. A second decomposition zone is defined by the corners of the triangle CuO—$Y_2BaCuO_5$—$YBa_2Cu_3O_{7-\delta}$. Every compound with a composition falling inside said zone will decompose to said corner compositions. A third decomposition zone is the triangle with the corners $YBa_2Cu_3O_{7-\delta}$—CuO—$BacuO_2$. Every compound within this zone will decompose into the products represented by said corner compositions.

Thus, any compound having a composition which lies inside the zone confined by the larger triangle CuO—$BaCuO_2$—2 $Y_2BaCuO_5$ will at decomposition at least produce the superconductive $YBa_2Cu_3O_{7-\delta}$. It may be emphasized that the non-superconductive compound $Y_2BaCuO_5$ in a stable compound which will not decompose and not produce the aforesaid superconductive material.

What is claimed is:

1. A method of manufacturing a wire of a superconducting oxide material comprising forming an essentially cylindrical preform comprising a rod-shaped filament (F) product embedded in, and surrounded by a matrix (M) product, the F and the M products both containing a binder in which pulverulent oxidic materials are dispersed, the pulverulent oxidic material present in the F product and the pulverulent oxidic material present in the M product being capable of reacting, in a solid state reaction, with each other to form a superconducting oxidic material of the formula $YBa_2Cu_3O_{7-\gamma}$, where $\gamma=0.1-0.5$, extruding said preform to form a wire of desired diameter, heating said wire to decompose and bake out said binder, then sintering said wire to thereby cause the pulverulent oxidic material present in the F product and pulverulent oxidic material present in the M product to react with each other at the interface of the F product and the M product and form said superconducting oxidic material.

2. The method of claim 1 wherein the F product comprises pulverulent $Y_2Ba_4O_7$ and the M product comprises pulverulent CuO.

3. The method of claim 1 wherein the F product comprises pulverulent $Y_2Cu_2O_5$ and the M product comprises $BaCuO_2$.

4. The method of claim 1 wherein the sintering is carried out at a temperature of 900° C.–1300° C.

5. The method of claim 4 wherein the sintering is carried out in an oxygen-containing atmosphere.

6. The method of claim 5 wherein the binder is decomposed and baked out at a temperature of 400°–600° C. in an oxygen-containing atmosphere.

7. A method as claimed in claim 1, in which an oxygen-containing binder is used.

8. A method as claimed in claim 1, in which the F product comprises pulverulent CuO and the M product comprises pulverulent $Y_2Ba_4O_7$.

9. A method as claimed in claim 1, in which the F product comprises pulverulent $BaCuO_2$ and the M product comprises pulverulent $Y_2Cu_2O_5$.

* * * * *